United States Patent
Kondo

(10) Patent No.: US 10,153,730 B2
(45) Date of Patent: Dec. 11, 2018

(54) RESONATOR DEVICE, MANUFACTURING RESONATOR DEVICE MANUFACTURING METHOD, OSCILLATOR, ELECTRONIC APPARATUS, VEHICLE, AND BASE STATION

(71) Applicant: SEIKO EPSON CORPORATION, Tokyo (JP)

(72) Inventor: Manabu Kondo, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 128 days.

(21) Appl. No.: 15/285,889

(22) Filed: Oct. 5, 2016

(65) Prior Publication Data

US 2017/0111010 A1    Apr. 20, 2017

(30) Foreign Application Priority Data

Oct. 19, 2015   (JP) ................................. 2015-205298

(51) Int. Cl.
| | |
|---|---|
| *H03B 28/00* | (2006.01) |
| *H03H 9/05* | (2006.01) |
| *H03H 9/10* | (2006.01) |

(52) U.S. Cl.
CPC ........... *H03B 28/00* (2013.01); *H03H 9/0547* (2013.01); *H03H 9/1021* (2013.01)

(58) Field of Classification Search
CPC ..................................................... H03B 28/00
USPC ............................................................. 331/70
See application file for complete search history.

(56) References Cited

U.S. PATENT DOCUMENTS

| | | | | |
|---|---|---|---|---|
| 6,049,256 A | * | 4/2000 | Fry | H03H 9/0528 310/343 |
| 6,501,340 B1 | * | 12/2002 | Flood | H03L 1/04 310/315 |
| 2002/0084858 A1 | * | 7/2002 | Luff | H03L 1/028 331/68 |
| 2014/0361845 A1 | | 12/2014 | Ito | |

FOREIGN PATENT DOCUMENTS

| | | |
|---|---|---|
| JP | 2000-101346 A | 4/2000 |
| JP | 2004-221793 A | 8/2004 |
| JP | 2014-241508 A | 12/2014 |
| JP | 2015-080057 A | 4/2015 |

* cited by examiner

Primary Examiner — Joseph Chang
(74) Attorney, Agent, or Firm — Oliff PLC

(57) ABSTRACT

A resonator device includes a resonator element, a package that accommodates the resonator element, a temperature control element arranged on a first surface of the package, and a circuit part arranged on a second surface of the package that faces away from the first surface.

19 Claims, 18 Drawing Sheets

RESONATOR DEVICE, MANUFACTURING RESONATOR DEVICE MANUFACTURING METHOD, OSCILLATOR, ELECTRONIC APPARATUS, VEHICLE, AND BASE STATION

CROSS-REFERENCE TO RELATED APPLICATIONS

This application claims priority to Japanese Patent Application No. 2015-205298, filed Oct. 19, 2015, the entirety of which is hereby incorporated by reference.

BACKGROUND

1. Technical Field

The present invention relates to a resonator device, a resonator device manufacturing method, an oscillator, an electronic apparatus, a vehicle, and a base station.

2. Related Art

There has been a known oscillator of related art described in JP-A-2004-221793. The oscillator described in JP-A-2004-221793 has a configuration in which a resonator formed of a resonator element accommodated in a package and electronic parts electrically connected to the resonator are mounted on a flexible substrate and the flexible substrate is so curved that the electronic parts are arranged over the package of the resonator. The configuration described above allows a complicated assembly step to be avoided.

Use of the thus configured oscillator as an oscillator having a thermostatic function (oscillator with thermostatic oven), however, undesirably causes the following problem: That is, an oscillator with a thermostatic oven requires a heater for keeping the temperature of a resonator element constant. For example, when the heater is too close to the electronic parts, the temperature of the electronic parts greatly deviates from the temperature of the resonator element, and the frequency of the oscillator is therefore likely to vary. In contrast, when the heater is too far away from the electronic parts, the distance from the heater to the package increases accordingly so that the temperature of the resonator element cannot be controlled with precision, and the frequency of the oscillator is also therefore likely to vary.

SUMMARY

An advantage of some aspects of the invention is to provide a resonator device having excellent frequency stability, a method for manufacturing the resonator device, and a reliable oscillator, electronic apparatus, vehicle, and base station including the resonator device.

The invention can be implemented as the following forms or application examples.

A resonator device according to an application example includes a resonator element, a package that accommodates the resonator element, a temperature control element arranged on a first surface of the package, and a circuit part arranged on a second surface of the package that faces away from the first surface.

The arrangement of the temperature control element can therefore be optimized with respect to the resonator element and the circuit part, whereby a resonator device having excellent frequency stability can be provided.

In the resonator device according to the application example, it is preferable that the package includes a base and a lid having thermal conductivity higher than thermal conductivity of the base, and that the temperature control element is arranged on the lid.

The temperature control element can therefore efficiently heat the resonator element.

It is preferable that the resonator device according to the application example further includes a substrate on which the package and the temperature control element are arranged, and the substrate has a first flexible section that has flexibility and is located between an area where the package is arranged and an area where the temperature control element is arranged.

The resonator device can therefore be readily assembled.

In the resonator device according to the application example, it is preferable that the substrate has an opening in a position that overlaps with the second surface, and that the circuit part is arranged in the opening.

The mounting of the circuit part is therefore not hindered.

In the resonator device according to the application example, it is preferable that the substrate has a rigid section harder than the first flexible section, and that the temperature control element is arranged in the rigid section.

The temperature control element can therefore be stably supported.

In the resonator device according to the application example, it is preferable that the first flexible section includes a wiring line electrically connected to the package.

The configuration of the resonator device is therefore further simplified.

It is preferable that the resonator device according to the application example further includes an electronic part arranged on a third surface that connects the first surface and the second surface of the package to each other, and it is preferable that the electronic part is arranged on the substrate, and that the substrate has a second flexible section that has flexibility and is located between the area where the package is arranged or the area where the temperature control element is arranged and an area where the electronic part is arranged.

The electronic part can therefore be arranged in an appropriate position, whereby a situation in which the temperature control element excessively heats the electronic part can be avoided, and an increase in size of the resonator device can be reduced. Further, the resonator device can be readily assembled.

It is preferable that the resonator device according to the application example further includes a support substrate that supports the substrate, and the temperature control element is arranged between the support substrate and the package.

Stress resulting from warpage or any other behavior of the support substrate is therefore unlikely to act on the resonator element.

A resonator device manufacturing method according to an application example includes preparing a substrate including a first flexible section having flexibility, a resonator including a resonator element and a package that accommodates the resonator element, and a temperature control element, arranging the resonator and the temperature control element on the substrate in such a way that the first flexible section is located between the resonator and the temperature control element, and arranging the temperature control element on a first surface of the package by curving or flexing the first flexible section.

A resonator device having excellent frequency stability can therefore be readily manufactured.

It is preferable that the method according to the application example further includes arranging a circuit part contained in a circuit that drives the resonator element on a second surface of the package that faces away from the first surface.

A situation in which the temperature control element excessively heats the circuit part can therefore be avoided.

In the method according to the application example, it is preferable that the arranging of the circuit part on the second surface is performed before the resonator is arranged on the substrate.

The resonator device can therefore be readily manufactured.

It is preferable that the method for manufacturing a resonator device according to the application example includes preparing a substrate including the first flexible section and a second flexible section each having flexibility, the resonator, the temperature control element, an electronic part, arranging the resonator and the temperature control element on the substrate in such a way that the first flexible section is located between the resonator and the temperature control element and arranging the electronic part on the substrate in such a way that the second flexible section is located between the resonator or the temperature control element and the electronic part, arranging the temperature control element on the first surface of the package by curving or flexing the first flexible section, and arranging the electronic part on a third surface that connects the first surface and the second surface of the package to each other by curving or flexing the second flexible section.

The resonator device can therefore be readily manufactured.

An oscillator according to an application example includes the resonator device according to the application example of the invention.

A reliable oscillator is therefore provided.

An electronic apparatus according to an application example includes the resonator device according to the application example of the invention.

A reliable electronic apparatus is therefore provided.

A vehicle according to an application example includes the resonator device according to the application example of the invention.

A reliable vehicle is therefore provided.

A base station according to an application example includes the resonator device according to the application example of the invention.

A reliable base station is therefore provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

A resonator device, a resonator device manufacturing method, an oscillator, an electronic apparatus, a vehicle, and a base station according to embodiments of the invention will be described below in detail with reference to the accompanying drawings.

First Embodiment

Figure 1:
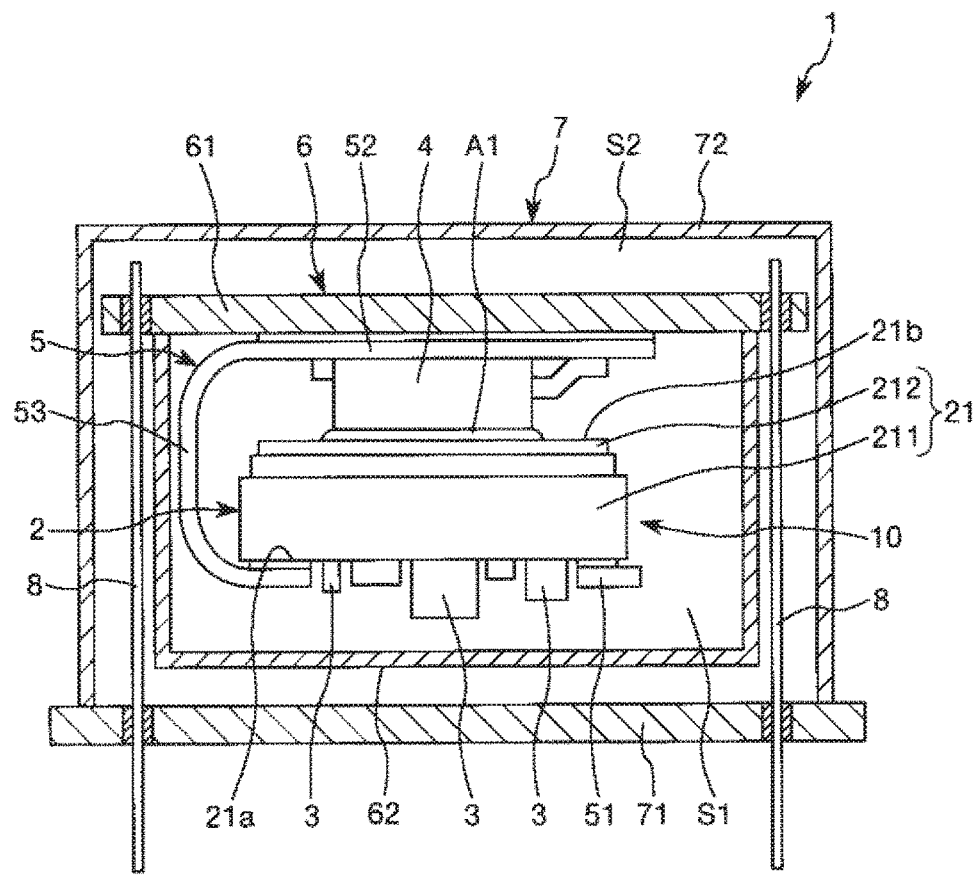
FIG. 1 is a cross-sectional view of an oscillator according to a first embodiment of the invention.
Figure 2:
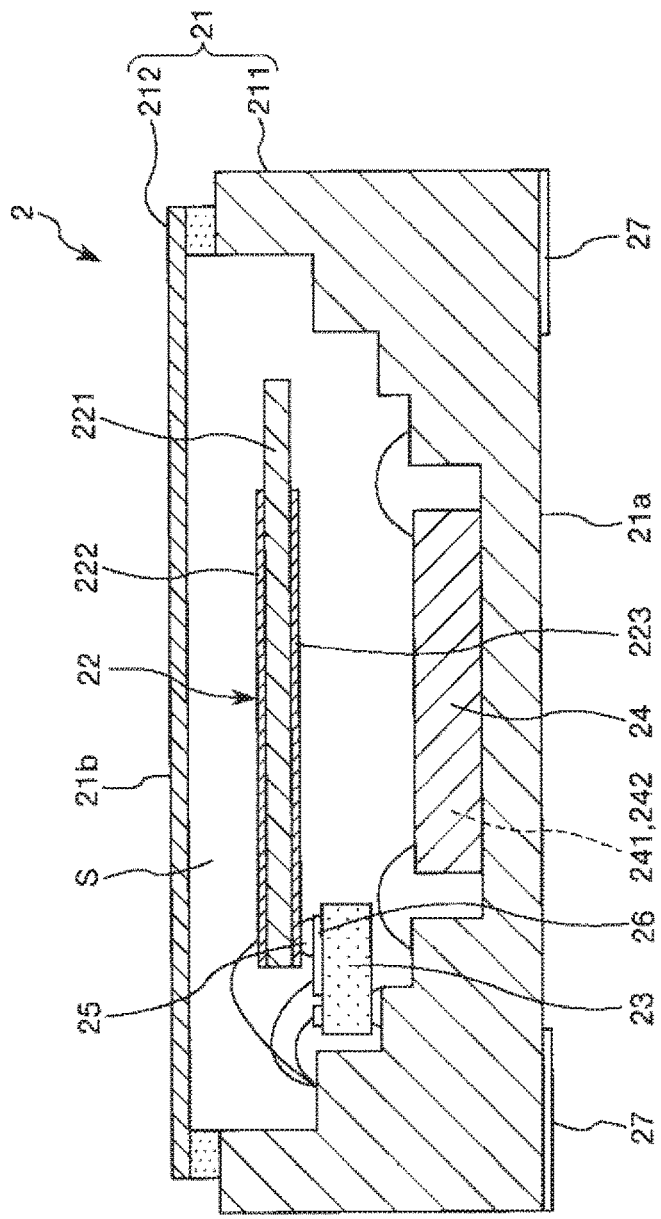
FIG. 2 is a cross-sectional view of a resonator provided in the oscillator shown in FIG. 1.
Figure 3:
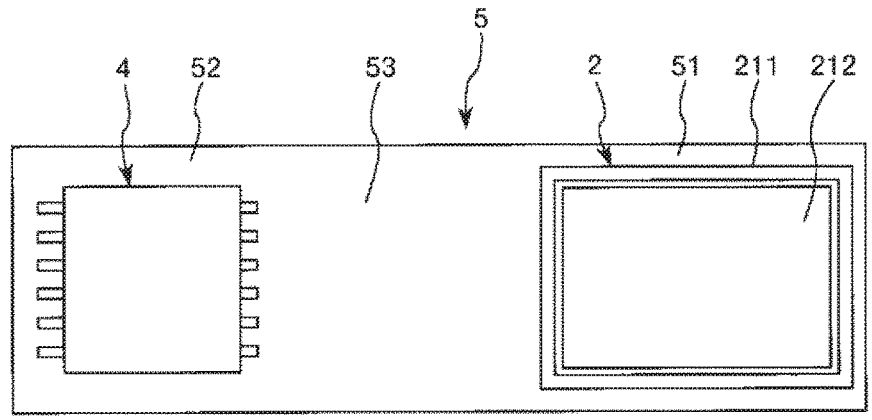
FIG. 3 is a top view of a substrate provided in the oscillator shown in FIG. 1.
Figure 4:
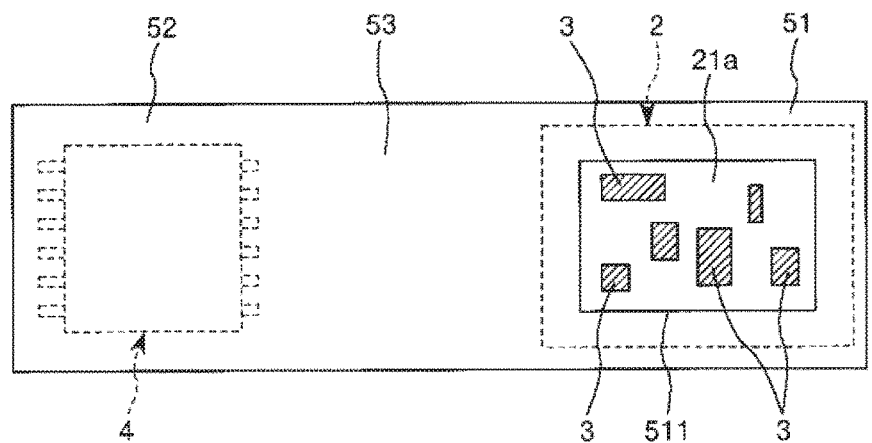
FIG. 4 is a bottom view of the substrate provided in the oscillator shown in FIG. 1.

FIG. 1 is a cross-sectional view of an oscillator according to a first embodiment of the invention. FIG. 2 is a cross-sectional view of a resonator provided in the oscillator shown in FIG. 1. FIG. 3 is a top view of a substrate provided in the oscillator shown in FIG. 1. FIG. 4 is a bottom view of the substrate provided in the oscillator shown in FIG. 1. FIGS. 5 to 10 are cross-sectional views for describing a method for manufacturing the oscillator shown in FIG. 1. In the following description, the upper side in FIG. 1 is also called "upper," and the lower side in FIG. 1 is also called "lower" for convenience of the description.

Oscillator

An oscillator (resonator device) 1 shown in FIG. 1 is an OCXO (oven controlled xtal oscillator). The oscillator 1 primarily includes a structural body 10, a first container 6, which accommodates the structural body 10, and a second container 7, which accommodates the first container 6. The structural body 10 includes a resonator 2, circuit parts 3, a heat generator (temperature control element) 4, and a substrate 5. Each of the components described above will be sequentially described below.

Resonator

The resonator 2 includes a package 21, a resonator element 22 accommodated in the package 21, a heat generator 23, and an IC (circuit element) 24, as shown in FIG. 2.

The package 21 has a cavity-shaped base 211, which has a recess that opens through the upper surface of the base 211, and a plate-shaped lid 212, which closes the opening of the recess and is bonded to the base 211. The base 211 is provided with inner terminals and outer terminals for electrical connection of the resonator element 22, the heat generator 23, and the IC 24. The thus configured package 21 has an internal space S, which accommodates the resonator element 22, the heat generator 23, and the IC 24. The internal space S is so hermetically sealed that a reduced pressure state (lower than or equal to about 10 Pa, preferably vacuum state) is achieved. The resonator element 22 can thus continuously vibrate in a stable manner. It is, however, noted that the internal space S does not necessarily have the reduced pressure atmosphere and may be filled, for example, with nitrogen, argon, or any other inert gas and have the atmospheric pressure.

The base 211 is not necessarily made of a specific material and can be made, for example, of an aluminum oxide or any of a variety of other ceramic materials, a glass material, or a metal material. The lid 212 is not necessarily made of a specific material and is preferably a member having a coefficient of linear expansion close to that of the material of which the base 211 is made. For example, in a case where the base 211 is made of the ceramic material described above, the lid 212 is preferably made of Kovar or any other alloy.

The heat generator 23 is fixed to the base 211. The heat generator 23 is an electronic part having what is called a "thermostatic function" of heating the resonator element 22 to keep the temperature of the resonator element 22 roughly constant. Providing the thus functioning heat generator 23 allows suppression of variation in the frequency of the oscillator due to a change in the temperature in the environment in which the oscillator is used, whereby the oscillator 1 has excellent frequency stability. The heat generator 23 preferably controls the temperature of the resonator element in such a way that the temperature approaches a top temperature (typically about 85°) representing a zero temperature coefficient. More excellent frequency stability can thus be provided.

The heat generator 23, for example, has a heat generating body formed of a power transistor and a temperature sensor formed of a diode or a thermistor, and the temperature sensor can control the temperature of the heat generating body to keep the temperature constant. The configuration of the heat generator 23 is not limited to a specific configuration and may be any configuration that can provide the thermostatic function described above.

The resonator element 22 is fixed to a terminal 26 on the heat generator 23 via an electrically conductive fixing member 25. Fixing the resonator element 22 to the heat generator 23 allows efficient transfer of the heat produced by the heat generator 23 to the resonator element 22. The resonator element 22 has a quartz crystal substrate 221, an excitation electrode 222, which is arranged on the upper surface of the quartz crystal substrate 221, and an excitation electrode 223, which is arranged on the lower surface of the quartz crystal substrate 221, and the resonator element 22 vibrates when drive voltage is applied between the excitation electrodes 222 and 223.

The quartz crystal substrate 221 is an SC cut quartz crystal substrate patterned in a predetermined shape (circular shape, for example). Use of an SC cut quartz crystal substrate reduces occurrence of a frequency jump due to spurious resonation and an increase in resistance, allowing the resonator element 22 to have a stable temperature characteristic. The quartz crystal substrate 221 is not limited to an SC cut quartz crystal substrate and may, for example, be an AT cut quartz crystal substrate or a BT cut quartz crystal substrate. The quartz crystal substrate 221 may undergo mesa processing, inverted-mesa processing, convex processing, or any other processing.

The IC 24 is fixed to the base 211. The IC 24 is electrically connected to the resonator element 22, the heat generator 23, and outer terminals 27 and can therefore not only control the resonator element 22 and the heat generator 23 but also communicate with an external apparatus via the outer terminals 27. The thus configured IC 24 has an oscillation circuit 241, which causes the resonator element 22 to oscillate (drives resonator element 22), and a temperature control circuit 242, which controls the heat generator 23 and the heat generator 4.

Circuit Parts

The circuit parts 3 are mounted (arranged) on the lower surface of the package 21 (bottom surface of base 211) at a plurality of locations, as shown in FIG. 1. The plurality of circuit parts 3 are circuit components that form, along with the IC 24 in the package 21, the oscillation circuit 241 and the temperature control circuit 242. The circuit parts 3 are not limited to specific parts and may, for example, be a resistor element, a capacitor element, and an inductor element.

Heat Generators

The heat generator 4 is bonded to an upper surface (lid 212) 21b of the package 21 via a fixing member A1, as shown in FIG. 1. The heat generator 4 is electrically connected to the resonator 2 via the substrate 5. The thus configured heat generator 4 is an electronic part having a function of heating the interior of the first container 6 to keep the temperature in the first container 6 roughly constant and a function of heating the resonator element 22 via the package 21. Providing the thus functioning heat generator 4 allows the oscillator 1 to be unlikely to be affected by a change in the temperature in the environment in which the oscillator 1 is used. The temperature set by the heat generator 4 is not limited to a specific value, and the heat generator 4 preferably sets the temperature in the first container 6 at a value (about 90° C.) slightly higher (by about 5° C.) than the upper limit of the temperature range over which the oscillator 1 is used (from −40° C. to 85° C., for example). As a result, the oscillator 1 is more unlikely to be affected by a change in the temperature in the environment in which the oscillator 1 is used, and electric power consumed by the heating operation can be reduced.

The heat generator 4 has the same configuration as that of the heat generator 23. That is, the heat generator 4, for example, has a heat generating body formed of a power transistor and a temperature sensor formed of a diode or a thermistor, and the temperature sensor can control the temperature of the heat generating body to keep the temperature constant. The configuration of the heat generator 4 is not limited to a specific configuration and may be any configuration that can provide the function described above. For example, the heat generator 4 may be a power transistor the temperature of which is controlled on the basis of the temperature detected with the temperature sensor contained in the heat generator 23. Instead, another temperature sensor may be provided in a position where the distance to the resonator element 22 is greater than the distance between the heat generator 4 and the resonator element 22, and the temperature of the heat generator 4 may be controlled on the basis of the temperature detected with the other temperature sensor. In this case, since the temperature in the position farther away from the resonator element 22 varies over a wider range, a change in the temperature can be detected in higher resolution.

The fixing member A1 is preferably made of a material having relatively high thermal conductivity (solder or any other metal material, for example). The heat generated by the heat generator 4 can therefore be efficiently transferred to the resonator 2 (resonator element 22). Both the heat generator 23 and the heat generator 4 can therefore heat the resonator element 22, whereby the thermostatic function of the oscillator 1 is further improved. Further, the period from the point of time when the resonator element 22 is activated to the point of time when the temperature of the resonator element 22 settles at a set temperature can be shortened. In particular, since the lid 212 of the package 21 is made of a metal that excels the material of the base 211 in thermal conductivity, the advantageous effect described above is more markedly provided.

A configuration in which the fixing member A1 is omitted and the heat generator 4 is not bonded to but is in contact with the upper surface of the package 21 may instead be employed.

The resonator 2, the circuit parts 3, and the heat generator 4 have been described above. In the oscillator 1, the heat generator 4 is arranged on the upper surface (first surface) 21b of the package 21, and the circuit parts 3 are arranged on the lower surface (second surface facing away from first surface) 21a of the package 21, as described above. In other words, the heat generator 4 and the circuit parts 3 are arranged with the package 21 interposed therebetween. The arrangement of these components allows the heat generator 4 and the circuit parts 3 to be appropriately separate from each other. As a result, first, a situation in which the heat generator 4 excessively or insufficiently heats the circuit parts 3 can be avoided, whereby the temperature of the circuit parts 3 can be closer to the temperature of the resonator element 22. The oscillation circuit 241 and the temperature control circuit 242 can therefore be stably driven. Second, the smaller the difference in temperature between the circuit parts 3 and the resonator element 22, the smaller the amount of heat exchange between the resonator element 22 and the circuit parts 3. The temperature of the resonator element 22 is therefore readily kept constant, whereby the oscillator 1 can show more excellent frequency stability. Third, since the spaces over the upper surface 21b and the lower surface 21a of the package 21 can be effectively used, the size of the oscillator 1 can be reduced.

Substrate

The substrate 5 mechanically and electrically connects the resonator 2 to the heat generator 4. The thus configured substrate 5 can be formed of a known flexible printed wiring board and has a sheet-shaped (film-shaped) base portion having flexibility and wiring lines (not shown) arranged in the base portion.

The substrate 5 has a belt-like shape and has a resonator mounting area 51, which is set at one end portion in the longitudinal direction, a heat generator mounting area 52, which is set at the other end portion in the longitudinal direction, and a flexible section 53, which is located between the two areas, as shown in FIG. 3. The resonator 2 is mounted on the resonator mounting area 51, and the heat generator 4 is mounted on the heat generator mounting area 52. Wiring lines that are not shown but are arranged in the substrate electrically connect the heat generator 4 and the resonator 2 to each other. The heat generator 4 can be arranged on the lower surface 21a of the package 21 by folding (curving or flexing) the substrate 5 along the flexible section 53.

An opening 511 is formed in the resonator mounting area 51, and the circuit parts 3 are arranged in the opening 511, as shown in FIG. 4. Providing the opening 511 allows the circuit parts 3 to be mounted on the lower surface 21a of the package 21. The shape of the opening 511 may be a closed shape that is not open to a side surface of the substrate 5, as in the present embodiment, or may be an open shape that is open to a side surface of the substrate 5.

Providing the thus shaped substrate 5 allows the oscillator 1 (structural body 10) to be readily assembled, as will be described with reference to a method for manufacturing the oscillator 1, which will be described later. Further, since the substrate 5 has flexibility, the substrate 5 is, for example, allowed to deform in conjunction with the thermal expansion of the package 21. Stress is therefore unlikely to act on the portion where the package 21 is bonded to the substrate 5, whereby the reliability of the mechanical, electrical connection between the package 21 and the substrate 5 is improved. In particular, in the case where the heat generator 4 performs the temperature control, as in the present embodiment, the temperature of the package 21 greatly differs between a state in which the oscillator 1 is powered on and a state in which the oscillator 1 is not powered on, and deformation of the oscillator 1 due to thermal expansion is greater than that of an oscillator including no heat generator. Even in this case, the reliability of the oscillator 1 can be improved. Further, in a case where impact is applied to the oscillator 1, the substrate 5 can ease the impact, and stress is unlikely to act on the portions where the package 21 and the heat generator 4 are bonded to the substrate 5, whereby the reliability of the mechanical, electrical connection between the package 21/the heat generator 4 and the substrate 5 is improved. Moreover, the wiring lines provided in the substrate 5 allow the resonator 2 and the heat generator 4 to be readily electrically connected to each other.

The resonator 2, the circuit parts 3, the heat generator 4, and the substrate 5, which form the structural body 10, have been described above.

First Container

The first container 6 has a support substrate 61 and a cap 62, which is bonded to the support substrate 61, and the structural body 10 is accommodated in an internal space S1 formed by the support substrate 61 and the cap 62, as shown in FIG. 1. The internal space S1 is so hermetically sealed that a reduced pressure state (lower than or equal to about 10 Pa, preferably vacuum state) is achieved. Thermal leakage due to convection can therefore be reduced. The temperature control can therefore be more stably performed with less power consumption. It is, however, noted that the internal space S1 does not necessarily have the reduced pressure atmosphere and may be filled, for example, with nitrogen, argon, or any other inert gas and have the atmospheric pressure or may be exposed to the atmosphere.

The support substrate 61 can be formed of a known rigid printed wiring board and has, for example, a hard base portion and wiring lines (not shown) arranged in the base portion. On the other hand, the cap 62 can be made, for example, of a metal material or a resin material.

The structural body 10, specifically, the rear surface of the heat generator mounting area 52 of the substrate 5 is bonded to the lower surface of the support substrate 61. The wiring lines provided in the substrate 5 are electrically connected to the wiring lines that are not shown but are provided in the support substrate 61. The arrangement described above allows the heat generator 4 to be located between the support substrate 61 and the package 21 and therefore prevents the support substrate 61 from being directly bonded to the package 21, whereby thermal stress resulting from the difference in the coefficient of linear expansion between the support substrate 61 and the package 21 is unlikely to act on the resonator 2. Degradation in the resonation characteristics due, for example, to flexure of the resonator element 22 is therefore reduced, whereby the oscillator 1 has excellent frequency stability.

Second Container

The second container 7 has a base 71 and a cap 72, which is bonded to the base 71, and the first container 6 is accommodated in an internal space S2 formed by the base 71 and the cap 72, as shown in FIG. 1. The internal space S2 is so hermetically sealed that a reduced pressure state (lower than or equal to about 10 Pa, preferably vacuum state) is achieved. Thermal leakage due to convection can therefore be reduced. The temperature control can therefore be performed with less power consumption. It is, however, noted that the internal space S2 does not necessarily have the reduced pressure atmosphere and may be filled, for example, with nitrogen, argon, or any other inert gas and have the atmospheric pressure or may be exposed to the atmosphere. The base 71 and the cap 72 can be made, for example, of a metal material or a resin material.

A plurality of through holes are formed in the base 71, and an electrically conductive pin 8 is inserted through each of the through holes. Each of the pins 8 is formed, for example, of a hermetic terminal, and the gap between each of the through holes and the corresponding pin 8 is hermetically sealed. An upper end portion of each of the pins 8 is fixed to the support substrate 61 of the first container 6 in such a way that the first container 6 is so fixed as to float in the second container 7. The oscillator 1 is therefore more unlikely to be affected by a change in the temperature in the environment in which the oscillator 1 is used. The pins 8 are electrically connected to the wiring lines provided in the support substrate 61. A lower end portion of each of the pins 8 is exposed to the space outside the oscillator 1, whereby the oscillator 1 can be mechanically and electrically connected to an external apparatus, such as a mother board, via the lower end portions of the pins 8.

Method for Manufacturing Oscillator

A method for manufacturing the oscillator 1 includes a preparation step of preparing the resonator 2 having the circuit parts 3 mounted on the lower surface 21a, the heat generator 4, and the substrate 5, an arrangement step of arranging the resonator 2 and the heat generator 4 on the substrate 5, an assembly step of producing the structural body 10 by folding the substrate 5 to arrange the heat generator on the upper surface 21b of the package 21, a first accommodation step of accommodating the structural body 10 in the first container 6, and a second accommodation step of accommodating the first container 6 in the second container 7. The manufacturing method including the steps described above will be described below in detail.

Preparation Step

The resonator 2 is first prepared, and the circuit parts 3 are then mounted on the lower surface 21a of the package 21. In addition to the above, the substrate 5 and the heat generator 4 are prepared. Mounting the circuit parts 3 on the resonator 2 in the present step allows the circuit parts 3 to be mounted on resonator 2 connected to no other member. The circuit parts 3 can therefore be readily mounted on the resonator 2. Further, since the oscillation circuit 241 and the temperature control circuit 242 are produced in the present step, the resonator 2 can be tested in terms of action, adjusted, and otherwise manipulated in a relatively early stage. It is, however, noted that the circuit parts 3 may be mounted on the resonator 2 after the arrangement step or the assembly step.

Arrangement Step

Figure 5:
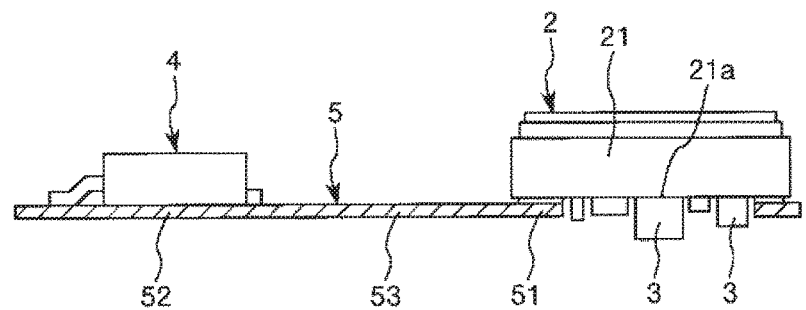
FIG. 5 is a cross-sectional view for describing a method for manufacturing the oscillator shown in FIG. 1.

The resonator 2 is mounted on the resonator mounting area 51 of the substrate 5, and the heat generator 4 is mounted on the heat generator mounting area 52, as shown in FIG. 5. As a result, the elements (resonator 2, circuit parts 3, heat generator 4, and substrate 5) that form the structural body 10 are united into one piece, which facilitates the following assembly step.

Assembly Step

Figure 6:
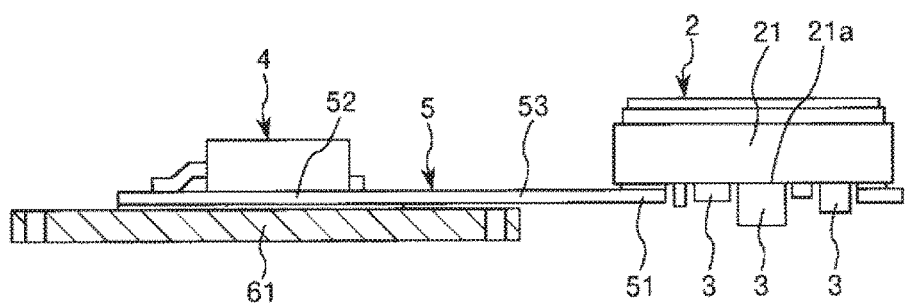
FIG. 6 is a cross-sectional view for describing the method for manufacturing the oscillator shown in FIG. 1.
Figure 7:
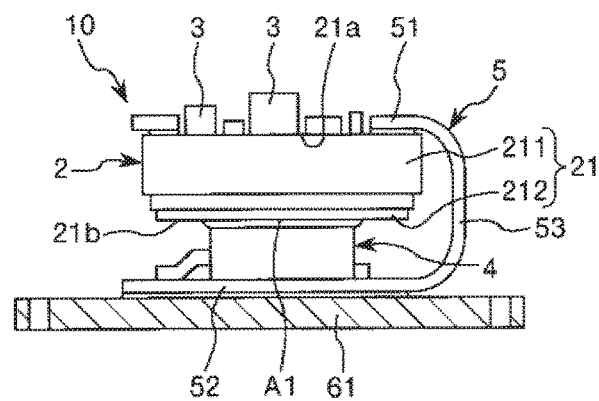
FIG. 7 is a cross-sectional view for describing the method for manufacturing the oscillator shown in FIG. 1.

First, the support substrate 61 is prepared, and the rear surface of the heat generator mounting area 52 of the substrate 5 is bonded onto the support substrate 61, as shown in FIG. 6. The fixing member A1 is then placed on the package 21 or the heat generator 4, and the upper surface 21b (lid 212) of the package 21 and the heat generator 4 are bonded to each other via the fixing member A1 by folding (flexing or curving) the flexible section 53 of the substrate 5, as shown in FIG. 7. The structural body 10 is thus produced. Using the substrate 5 to link the resonator 2 and the heat generator 4 to each other as described above allows the resonator 2 to be readily handled and the resonator 2 and the heat generator 4 to be readily bonded to each other as compared with a case where the resonator 2 and the heat generator 4 are apart from each other. Further, since the resonator 2 and the heat generator 4 are electrically connected to each other via the substrate 5, no step of electrically connecting the resonator 2 and the heat generator 4 to each other (wire bonding process, for example) is required after the resonator 2 and the heat generator 4 are bonded to each other. Use of the substrate 5 therefore facilitates the present step.

First Accommodation Step

Figure 8:
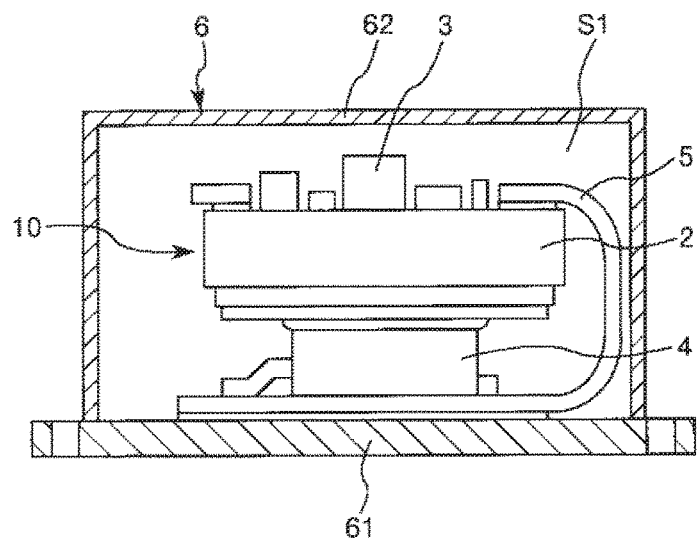
FIG. 8 is a cross-sectional view for describing the method for manufacturing the oscillator shown in FIG. 1.

The cap 62 is bonded to the support substrate 61 under a reduced pressure environment, as shown in FIG. 8. The first container 6 is thus formed, and a state in which the structural body 10 is accommodated in the first container 6 is achieved.

Second Accommodation Step

Figure 9:
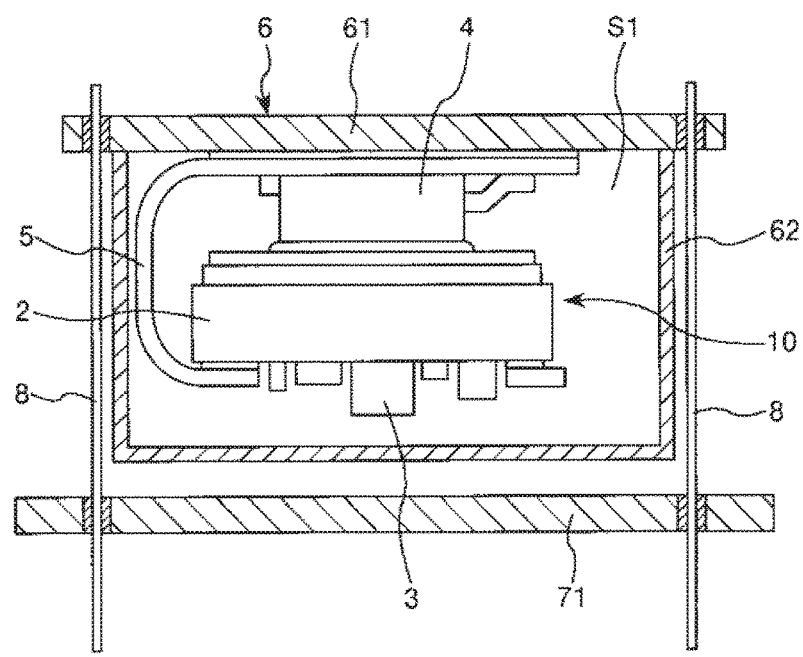
FIG. 9 is a cross-sectional view for describing the method for manufacturing the oscillator shown in FIG. 1.
Figure 10:
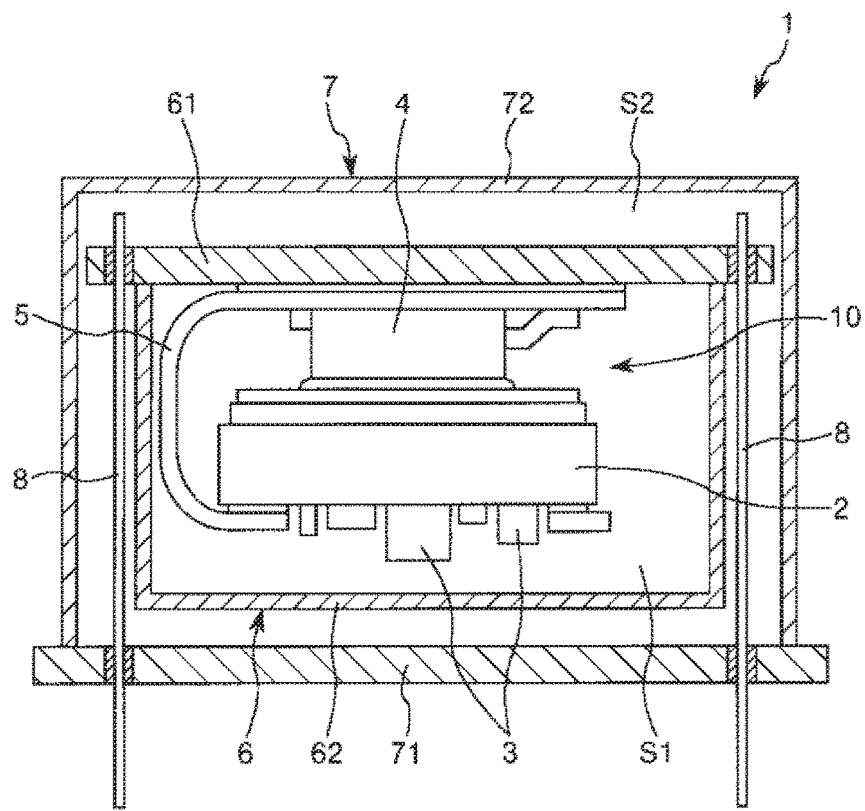
FIG. 10 is a cross-sectional view for describing the method for manufacturing the oscillator shown in FIG. 1.

First, the base 71 provided with the pins 8 is prepared, and the support substrate 61 of the first container 6 is fixed to the upper end portions of the pins 8, as shown in FIG. 9. The cap 72 is then bonded to the base 71 under a reduced pressure environment, as shown in FIG. 10. The second container 7 is thus formed, and a state in which the first container 6 is accommodated in the second container 7 is achieved.

The oscillator 1 is produced as described above. According to the method for manufacturing the oscillator 1 described above, the oscillator 1 can be readily manufactured.

Second Embodiment

Figure 11:
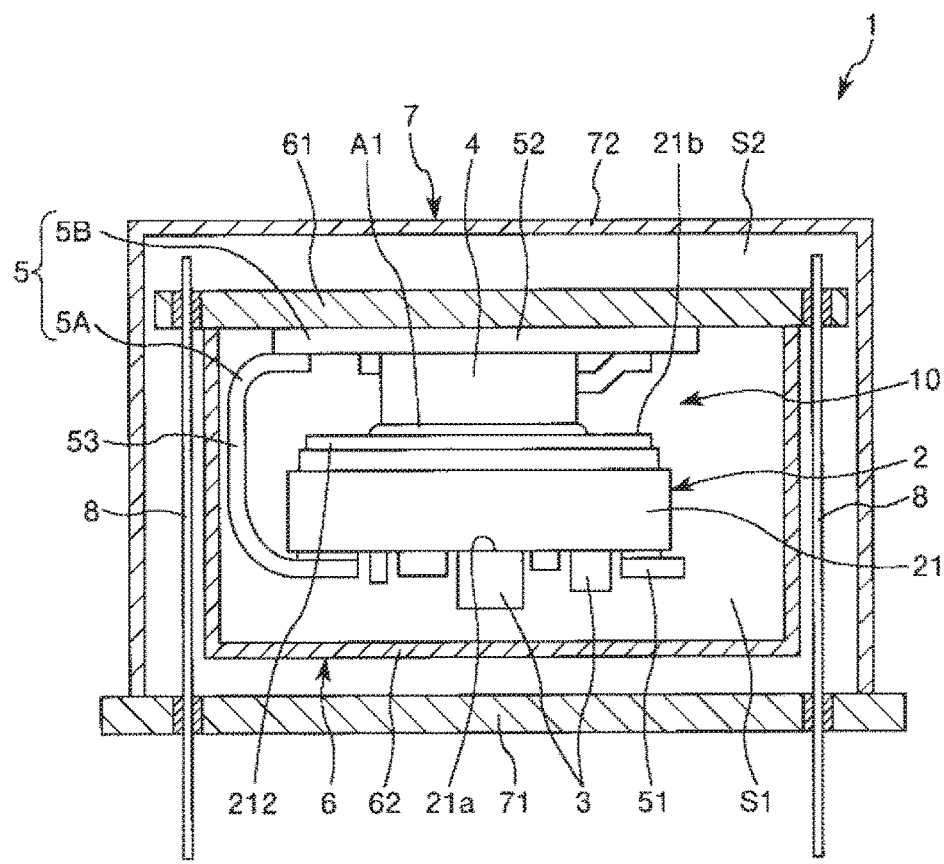
FIG. 11 is a cross-sectional view of an oscillator according to a second embodiment of the invention.
Figure 12:
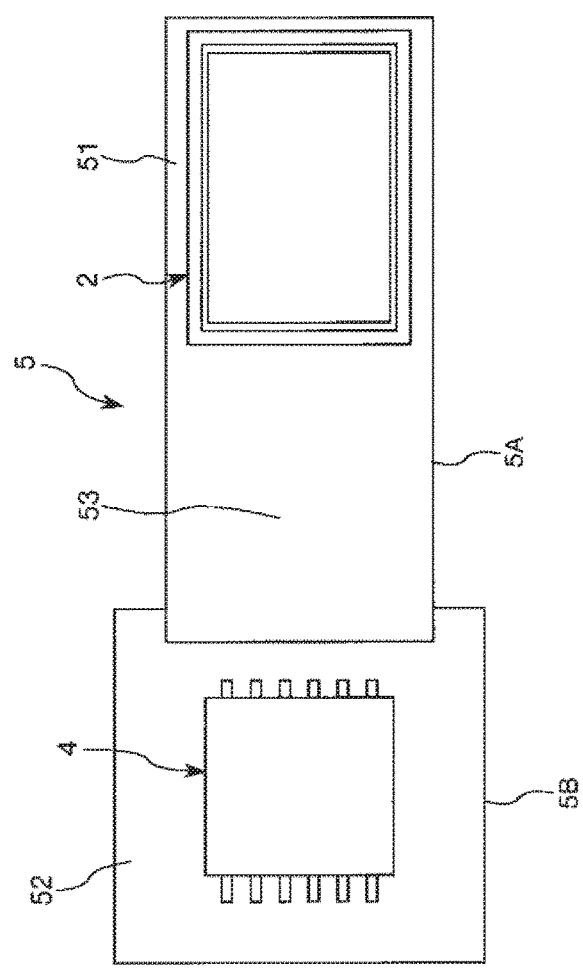
FIG. 12 is a top view of a substrate provided in the oscillator shown in FIG. 11.
Figure 13:
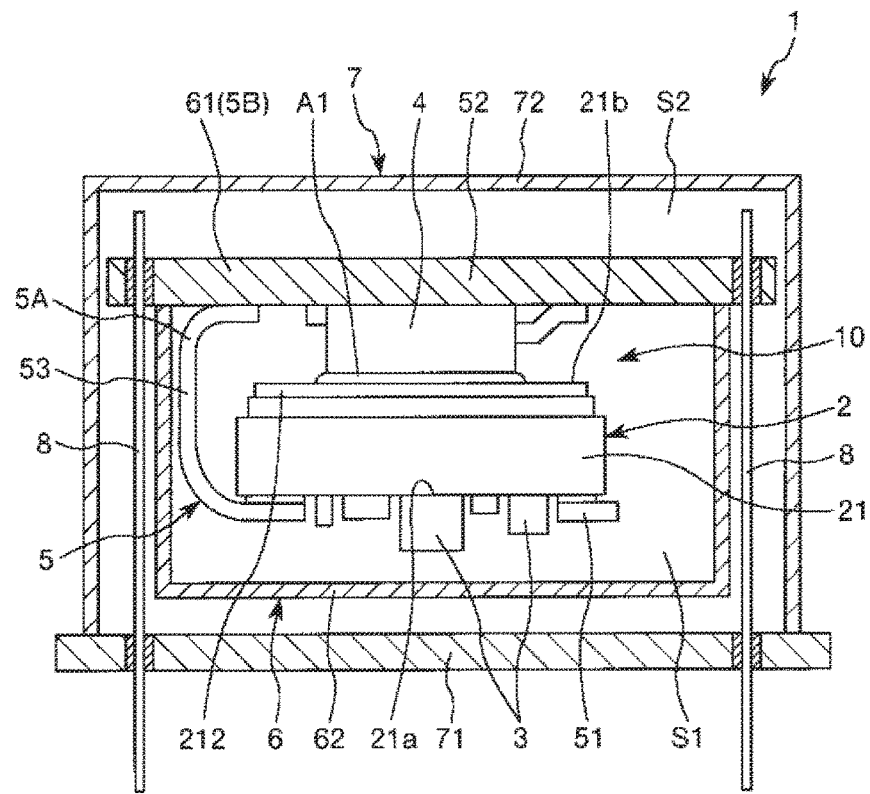
FIG. 13 is a cross-sectional view showing a variation of the oscillator shown in FIG. 11.

FIG. 11 is a cross-sectional view of an oscillator according to a second embodiment of the invention. FIG. 12 is a top view of a substrate provided in the oscillator shown in FIG. 11. FIG. 13 is a cross-sectional view showing a variation of the oscillator shown in FIG. 11.

The oscillator according to the second embodiment will be described below primarily on a difference from the embodiment described above, and the same items will not be described.

The oscillator according to the second embodiment is the same as the oscillator according to the first embodiment described above primarily except that the substrate is configured differently. In FIGS. 11 to 13, the same configurations as those in the embodiment described above have the same reference characters.

The substrate 5 in the present embodiment has a flexible substrate (flexible section) 5A, which has flexibility, and a rigid substrate (rigid section) 5B, which is harder than the flexible substrate 5A, and one end portion of the flexible substrate 5A is mechanically and electrically connected to the rigid substrate 5B, as shown in FIGS. 11 and 12. The substrate 5 has the resonator mounting area 51, which is provided as part of the flexible substrate 5A, the heat generator mounting area 52, which is provided as part of the rigid substrate 5B, and the flexible section 53, which is located between the two areas. The resonator 2 is mounted on the resonator mounting area 51, and the heat generator 4 is mounted on the heat generator mounting area 52. The heat generator 4 is arranged on the upper surface 21b of the package 21 by folding the substrate 5 along the flexible section 53. According to the thus configured substrate 5, since the heat generator 4 is mounted on the rigid substrate 5B, the heat generator 4 can be supported more stably.

The second embodiment described above can also provide the same advantageous effects as those provided by the first embodiment described above.

In the present embodiment, the structural body 10 is bonded to the support substrate 61 via the rigid substrate 5B. Instead, for example, the support substrate 61 may also serve as the rigid substrate 5B, as shown in FIG. 13. As a result, the number of parts can be reduced, and the size of the oscillator 1 can be reduced. In particular, since each of the support substrate 61 and the rigid substrate 5B can be formed of a rigid printed wiring board, it is easy for the support substrate 61 to also serve as the rigid substrate 5B.

Third Embodiment

Figure 14:
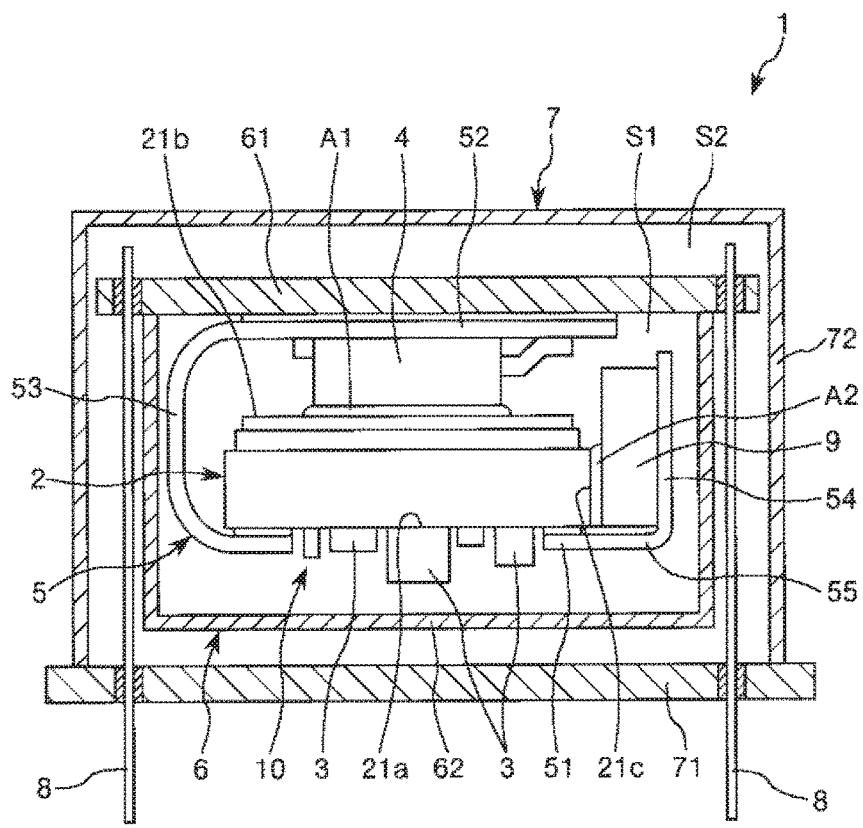
FIG. 14 is a cross-sectional view of an oscillator according to a third embodiment of the invention.
Figure 15:
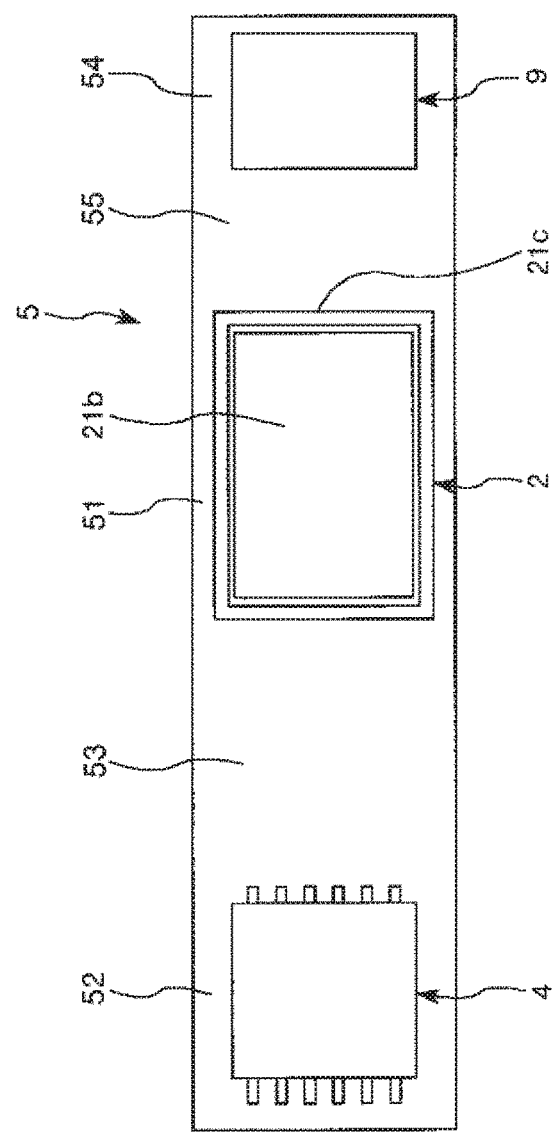
FIG. 15 is a top view of a substrate provided in the oscillator shown in FIG. 14.
Figure 16:
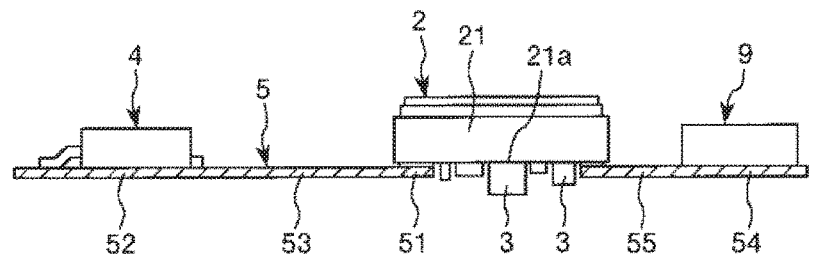
FIG. 16 is a cross-sectional view for describing a method for manufacturing the oscillator shown in FIG. 14.
Figure 17:
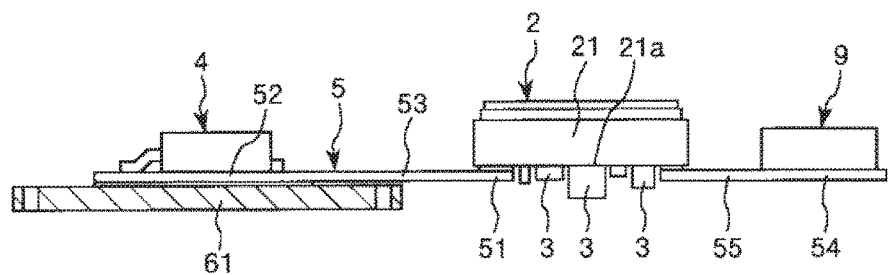
FIG. 17 is a cross-sectional view for describing the method for manufacturing the oscillator shown in FIG. 14.
Figure 18:
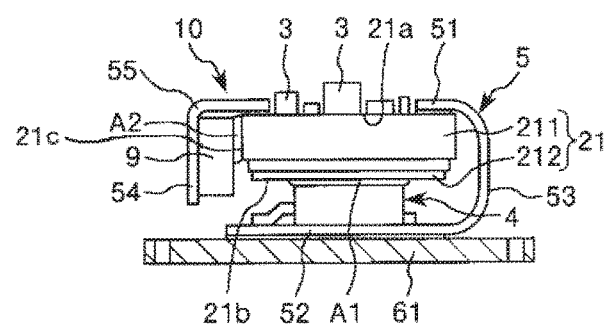
FIG. 18 is a cross-sectional view for describing the method for manufacturing the oscillator shown in FIG. 14.
Figure 19:
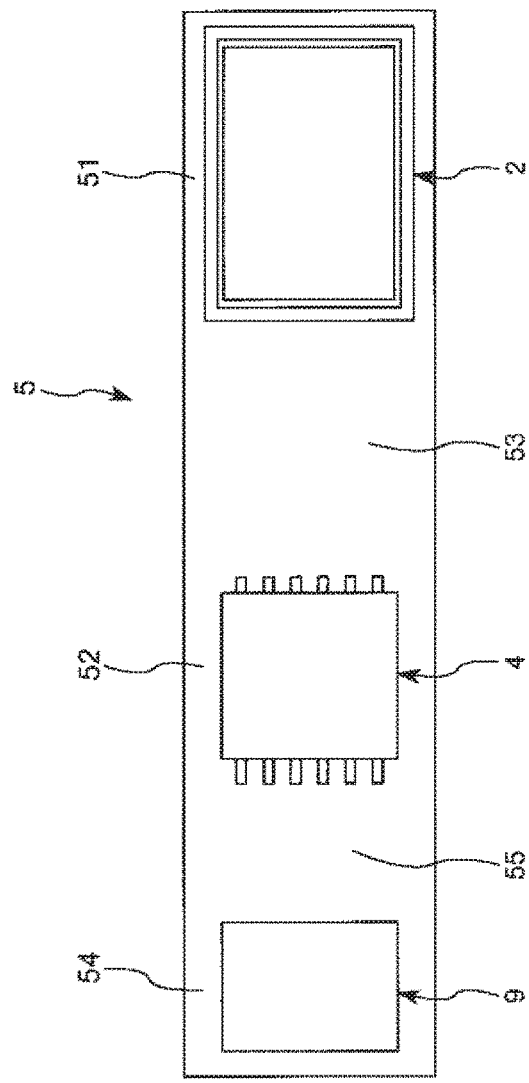
FIG. 19 is a top view showing a variation of the substrate shown in FIG. 15.

FIG. 14 is a cross-sectional view of an oscillator according to a third embodiment of the invention. FIG. 15 is a top view of a substrate provided in the oscillator shown in FIG. 14. FIGS. 16 to 18 are cross-sectional views for describing a method for manufacturing the oscillator shown in FIG. 14. FIG. 19 is a top view showing a variation of the substrate shown in FIG. 15.

The oscillator according to the third embodiment will be described below primarily on a difference from the embodiments described above, and the same items will not be described.

The oscillator according to the third embodiment is the same as the oscillator according to the first embodiment described above primarily except that the structural body is configured differently. In FIGS. 14 and 15, the same configurations as those in the embodiments described above have the same reference characters.

The structural body 10 in the present embodiment further includes an electronic part 9 as well as the resonator 2, the circuit parts 3, the heat generator 4, and the substrate 5, as shown in FIG. 14. The electronic part 9 is fixed to a side surface (third surface that connects the upper surface 21b and the lower surface 21a to each other) of the package 21 of the resonator 2 via a fixing member A2. The electronic part 9 is electrically connected to the resonator 2 via the substrate 5.

The electronic part 9 is not limited to a specific part and is preferably a part having a temperature characteristic (property that characteristic changes with temperature). According to the present configuration, since the electronic part 9 is in contact with the package 2 via the fixing member A2, the temperature of the electronic part 9 is allowed to approach the temperature of the package 21 (resonator 2), and the temperature of the electronic part 9 can further be kept roughly constant. The electronic part 9 can therefore be stably driven. Examples of the part having a temperature characteristic may include the oscillation circuit 241, the temperature control circuit 242, a power source voltage generation circuit, a reference voltage generation circuit (regulator), and a PLL circuit that refers to an output signal from the resonator 2. It is, however, noted that the electronic part 9 may have no temperature characteristic.

The substrate 5 has a belt-like shape and has an electronic part mounting area 54, which is set at one end portion in the longitudinal direction, the heat generator mounting area 52, which is set at the other end portion in the longitudinal direction, and the resonator mounting area 51, which is set between the electronic part mounting area 54 and the heat generator mounting area 52, the flexible section (first flexible section) 53, which is located between the resonator mounting area 51 and the heat generator mounting area 52, and a flexible section (second flexible section) 55, which is located between the resonator mounting area 51 and the electronic part mounting area 54, as shown in FIG. 15. The resonator 2 is mounted on the resonator mounting area 51, the heat generator 4 is mounted on the heat generator mounting area 52, and the electronic part 9 is mounted on the electronic part mounting area 54. The resonator 2, the heat generator 4, and the electronic part 9 are electrically connected to each other via the wiring lines provided in the substrate 5. The heat generator 4 can be arranged on the upper surface 21b of the package 21 and the electronic part 9 can be arranged on the side surface 21c of the package 21 by folding the substrate 5 along the flexible sections 53 and 55.

Method for Manufacturing Oscillator

A method for manufacturing the oscillator 1 includes a preparation step of preparing the resonator 2 on which the circuit parts 3 are mounted, the heat generator 4, the electronic part 9, and the substrate 5, an arrangement step of arranging the resonator 2, the heat generator 4, and the electronic part 9 on the substrate 5, an assembly step of producing the structural body 10 by folding the substrate 5 to arrange the heat generator 4 on the upper surface 21b of the package 21 and arrange the electronic part 9 on the side surface 21c of the package 21, a first accommodation step of accommodating the structural body 10 in the first container 6, and a second accommodation step of accommodating the first container 6 in the second container 7. These steps are the same as those in the first embodiment described above except the arrangement step and the assembly step, and only the arrangement step and the assembly step will therefore be described below.

Arrangement Step

The resonator 2 is mounted on the resonator mounting area 51 of the substrate 5, the heat generator 4 is mounted on the heat generator mounting area 52, and the electronic part 9 is mounted on the electronic part mounting area 54, as shown in FIG. 16. The elements (resonator 2, circuit parts 3, heat generator 4, electronic part 9, and substrate 5) that form the structural body 10 are thus united into one piece, which facilitates the following assembly step.

Assembly Step

First, the support substrate 61 is prepared, and the rear surface of the heat generator mounting area 52 of the substrate 5 is bonded onto the support substrate 61, as shown in FIG. 17. The fixing member A1 is then placed on the lid 212 or the heat generator 4, and the fixing member A2 is placed on the side surface 21c or the electronic part 9. The heat generator 4 is bonded to the upper surface 21b of the package 21 by folding (curving or flexing) the flexible section 53, and the electronic part 9 is bonded to the side surface 21c of the package 21 by folding the flexible section 55, as shown in FIG. 18. The structural body 10 is thus produced.

The third embodiment described above can also provide the same advantageous effects as those provided by the first embodiment described above.

As a variation of the substrate 5, the electronic part mounting area 54 may be located at the one end portion in the longitudinal direction, the resonator mounting area 51 may be located at the other end portion in the longitudinal direction, the heat generator mounting area 52 may be located between the electronic part mounting area 54 and the resonator mounting area 51, the flexible section 53 may be located between the resonator mounting area 51 and the heat generator mounting area 52, and the flexible section 55 may be located between the heat generator mounting area 52 and the electronic part mounting area 54, as shown in FIG. 19. The configuration described above also allows the same arrangement in the present embodiment by folding the flexible sections 53 and 55.

Electronic Apparatus

An electronic apparatus including the resonator device according to any of the embodiments of the invention will next be described.

Figure 20:
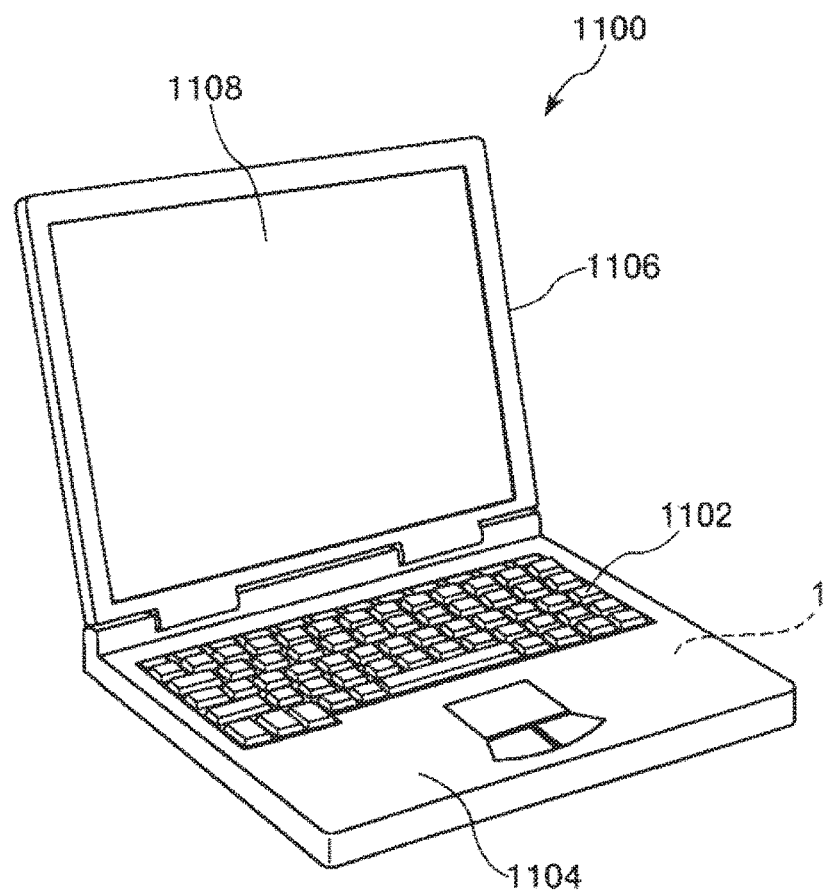
FIG. 20 is a perspective view showing the configuration of a mobile (or notebook) personal computer to which the invention is applied.

FIG. 20 is a perspective view showing the configuration of a mobile (or notebook) personal computer that is an example of the electronic apparatus using the resonator device according to any of the embodiments of the invention.

In FIG. 20, a personal computer 1100 is formed of a body section 1104 including a keyboard 1102 and a display unit 1106 including a display section 1108, and the display unit 1106 is so supported by the body section 1104 via a hinge structure that the display unit 1106 is pivotal relative to the body section 1104. The thus configured personal computer 1100 accommodates the oscillator 1.

Figure 21:
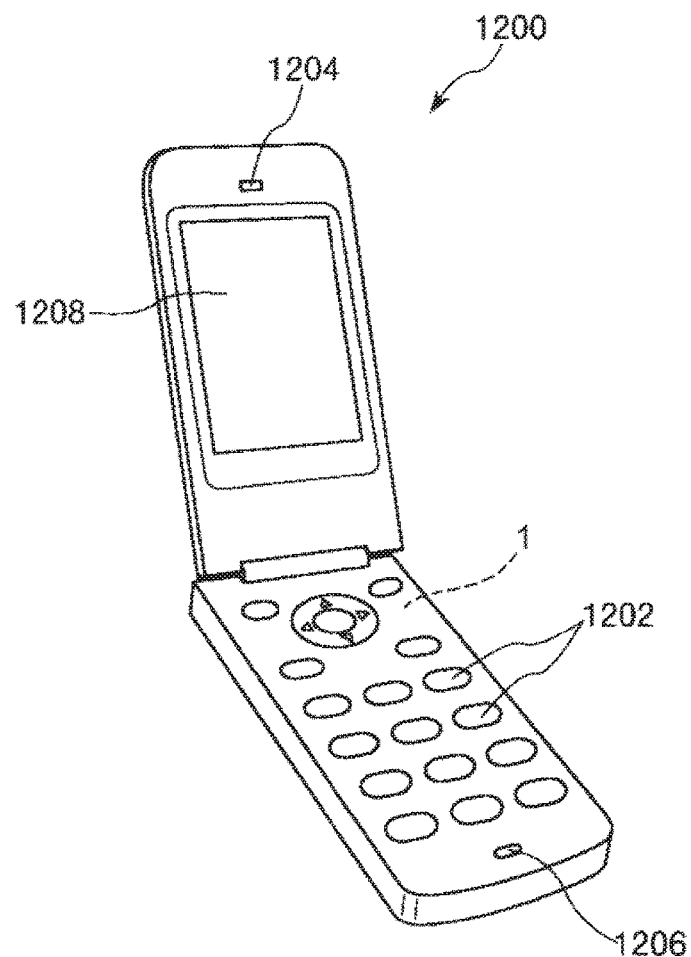
FIG. 21 is a perspective view showing the configuration of a mobile phone (including PHS) to which the invention is applied.

FIG. 21 is a perspective view showing the configuration of a mobile phone (including PHS) that is an example of the electronic apparatus using the resonator device according to any of the embodiments of the invention.

In FIG. 21, a mobile phone 1200 includes an antenna (not shown), a plurality of operation buttons 1202, a voice receiver 1204, and a voice transmitter 1206, and a display section 1208 is arranged between the operation buttons 1202 and the voice receiver 1204. The thus configured mobile phone 1200 accommodates the oscillator 1.

Figure 22:
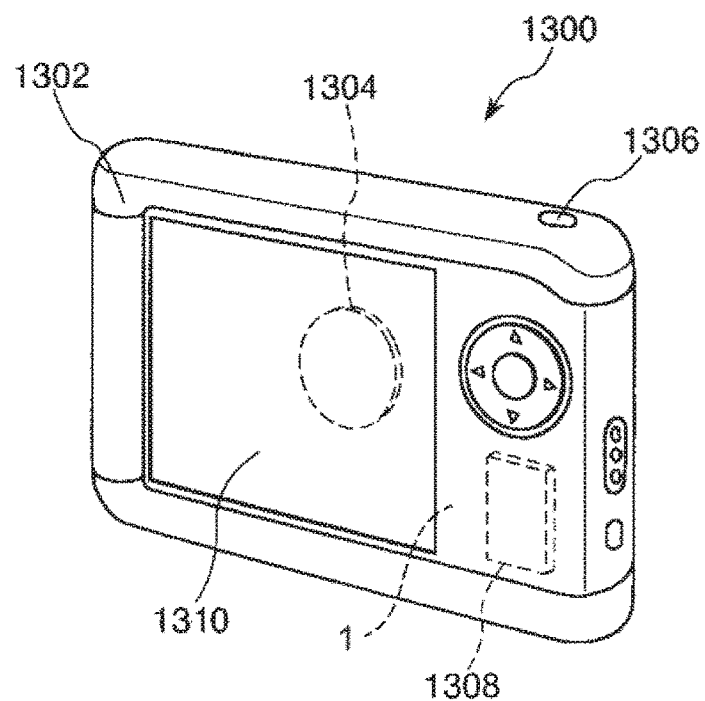
FIG. 22 is a perspective view showing the configuration of a digital still camera to which the invention is applied.

FIG. 22 is a perspective view showing the configuration of a digital still camera that is an example of the electronic apparatus using the resonator device according to any of the embodiments of the invention.

A display section 1310 is provided on the rear side of a case (body) 1302 of a digital still camera 1300 and displays an image based on a captured image signal from a CCD. The display section 1310 thus functions as a finder that displays a subject in the form of an electronic image. Further, a light receiving unit 1304 including an optical lens (imaging system), the CCD, and other components is provided on the front side (rear side in FIG. 22) of the case 1302. When a user of the camera checks a subject image displayed in the display section 1310 and presses a shutter button 1306, a captured image signal from the CCD at that point of time is transferred to and stored in a memory 1308. The thus configured digital still camera 1300 accommodates the oscillator 1.

The electronic apparatus described above, each of which includes the oscillator 1, has excellent reliability.

The electronic apparatus according to an embodiment of the invention is not limited to the personal computer shown in FIG. 20, the mobile phone shown in FIG. 21, or the digital still camera shown in FIG. 22 and can, for example, be a smartphone, a tablet terminal, a timepiece (including smartwatch), an inkjet-type liquid ejection apparatus (inkjet printer, for example), a laptop personal computer, a television receiver, an HMD (head mounted display) and other wearable terminals, a video camcorder, a video tape recorder, a car navigator, a pager, an electronic notebook (including electronic notebook having communication capability), an electronic dictionary, a desktop calculator, an electronic game console, a word processor, a workstation, a TV phone, a security television monitor, electronic binoculars, a POS terminal, a medical apparatus (such as electronic thermometer, blood pressure gauge, blood sugar meter, electrocardiograph, ultrasonic diagnostic apparatus, and electronic endoscope), a fish finder, a variety of measuring apparatus, an apparatus for a mobile terminal base station, a variety of instruments (such as instruments in vehicles, air planes, and ships), a flight simulator, and a network server.

Vehicle

A vehicle including the resonator device according to any of the embodiments of the invention will next be described.

Figure 23:
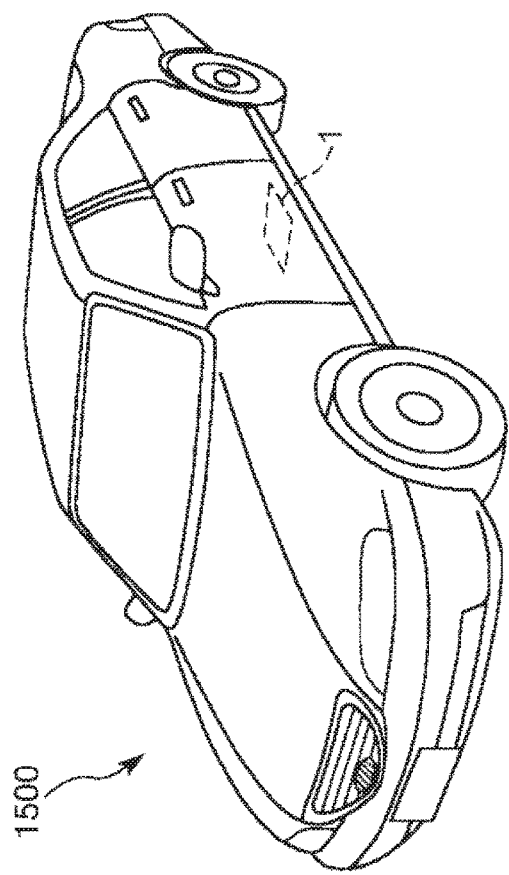
FIG. 23 is a perspective view showing an automobile to which the invention is applied.

FIG. 23 is a perspective view showing an automobile that is an example of a vehicle using the resonator device according to any of the embodiments of the invention.

An automobile 1500 accommodates the oscillator 1, as shown in FIG. 23. The oscillator 1 can also be widely used, for example, as a keyless entry system, an immobilizer, a car navigation system, a car air conditioner, an anti-lock braking system (ABS), an airbag, a tire pressure monitoring system (TPMS), an engine control system, an apparatus that monitors a battery in a hybrid automobile and an electric automobile, a vehicle body attitude control system, or any other electronic control unit (ECU). The automobile 1500, which accommodates the oscillator 1, can be a reliable automobile.

Base Station

A base station including the resonator device according to any of the embodiments of the invention will next be described.

Figure 24:
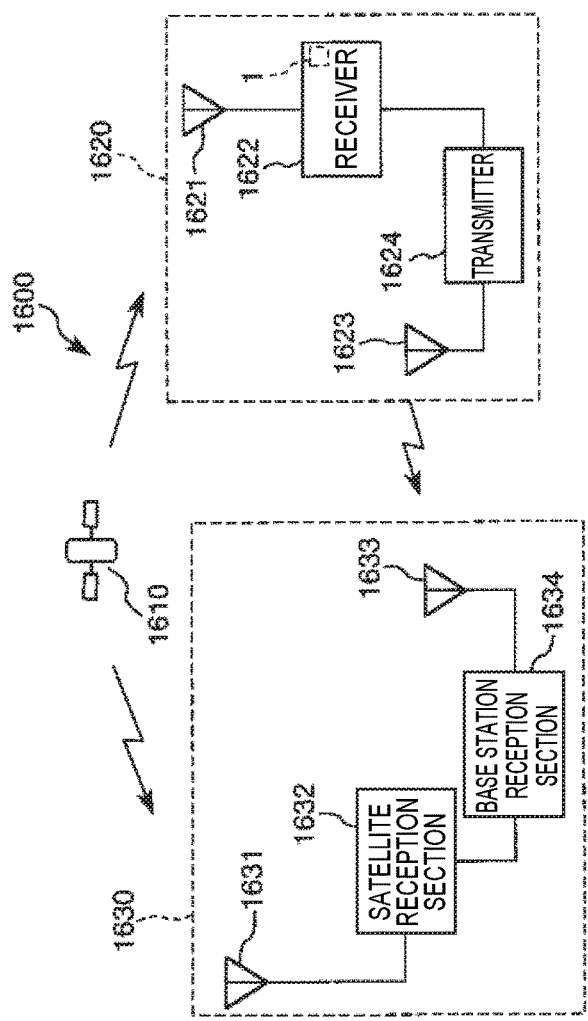
FIG. 24 is a schematic configuration diagram showing a positioning system to which the invention is applied.

FIG. 24 is a schematic configuration diagram showing a positioning system including a base station using the resonator device according to any of the embodiments of the invention.

A positioning system 1600 shown in FIG. 24 is formed of a GPS satellite 1610, abase station 1620, and a GPS receiver 1630. The GPS satellite 1610 transmits positioning information (GPS signal). The base station 1620 includes a receiver 1622, which precisely receives the positioning information from the GPS satellite 1610 via an antenna 1621 installed, for example, at an electronic reference point (GPS continuous observation station), and a transmitter 1624, which transmits the positioning information received by the receiver 1622 via an antenna 1623. Further, the positioning information received by the receiver 1622 is transmitted by the transmitter 1624 in real time. The receiver 1622 accommodates the oscillator 1 as a reference frequency oscillation source. The GPS receiver 1630 includes a satellite reception section 1632, which receives the positioning information from the GPS satellite 1610 via an antenna 1631, and abase station reception section 1634, which receives the positioning information from the base station 1620 via an antenna 1633. The positioning system 1600, which includes the oscillator 1, has excellent reliability.

The resonator device, the method for manufacturing the resonator device, the oscillator, the electronic apparatus, the vehicle, and the base station according to the embodiments of the invention have been described with reference to the drawings, but the invention is not limited thereto. The configuration of each portion can be replaced with an arbitrary configuration having the same function. Further, another arbitrarily configured object may be added to the embodiments of the invention.

What is claimed is:

1. A resonator device comprising:
   a resonator element;
   a package that accommodates the resonator element;
   a temperature control element arranged on a first surface of the package; and
   a circuit part arranged on a second surface of the package that faces away from the first surface,
   wherein the package includes a base and a lid having thermal conductivity higher than thermal conductivity of the base, and
   the temperature control element is arranged on the lid.

2. An oscillator comprising the resonator device according to claim 1.

3. An electronic apparatus comprising the resonator device according to claim 1.

4. A vehicle comprising the resonator device according to claim 1.

5. A base station comprising the resonator device according to claim 1.

6. A resonator device manufacturing method, the method comprising:
   arranging a package that accommodates a resonator element and a temperature control element on a substrate comprising a first flexible section having flexibility in such a way that the first flexible section is located between the package and the temperature control element; and
   arranging the temperature control element on a first surface of the package by flexing the first flexible section.

7. The method according to claim 6, further comprising arranging a circuit part of a circuit that drives the resonator element on a second surface of the package that faces away from the first surface.

8. The method according to claim 7, wherein the arranging of the circuit part on the second surface is performed before the package is arranged on the substrate.

9. The method according to claim 7,
   wherein the substrate further includes a second flexible section having flexibility,
   the method further comprising:
   arranging the electronic part on the substrate in such a way that the second flexible section is located between the package or the temperature control element and the electronic part;
   arranging the temperature control element on the first surface of the package by flexing the first flexible section; and
   arranging the electronic part on a third surface that connects the first surface and the second surface of the package to each other by flexing the second flexible section.

10. A resonator device comprising:
    a resonator element;
    a package that accommodates the resonator element;
    a temperature control element arranged on a first surface of the package;
    a circuit part arranged on a second surface of the package that faces away from the first surface; and
    a substrate on which the package and the temperature control element are arranged,
    wherein the substrate includes a first flexible section that has flexibility and is located between an area where the package is arranged and an area where the temperature control element is arranged.

11. The resonator device according to claim 10,
    wherein the substrate has an opening in a position that overlaps with the second surface, and
    the circuit part is arranged in the opening.

12. The resonator device according to claim 10,
    wherein the substrate includes a rigid section harder than the first flexible section, and
    the temperature control element is arranged in the rigid section.

13. The resonator device according to claim 10,
    wherein the first flexible section includes a wiring line electrically connected to the package.

14. The resonator device according to claim 10, further comprising an electronic part arranged on a third surface that connects the first surface and the second surface of the package to each other,
    wherein the electronic part is arranged on the substrate, and
    the substrate includes a second flexible section that has flexibility and is located between the area where the package is arranged or the area where the temperature control element is arranged and an area where the electronic part is arranged.

15. The resonator device according to claim 10, further comprising a support substrate that supports the substrate,
    wherein the temperature control element is arranged between the support substrate and the package.

16. An oscillator comprising the resonator device according to claim 10.

17. An electronic apparatus comprising the resonator device according to claim 10.

18. A vehicle comprising the resonator device according to claim 10.

19. A base station comprising the resonator device according to claim 10.

* * * * *